(12) United States Patent
Choi

(10) Patent No.: US 10,811,438 B2
(45) Date of Patent: Oct. 20, 2020

(54) THIN-FILM TRANSISTOR ARRAY SUBSTRATE AND ORGANIC LIGHT-EMITTING DISPLAY DEVICE INCLUDING THE SAME

(71) Applicant: LG Display Co., Ltd., Seoul (KR)

(72) Inventor: Kimin Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 128 days.

(21) Appl. No.: 16/162,348

(22) Filed: Oct. 16, 2018

(65) Prior Publication Data

US 2019/0164999 A1   May 30, 2019

(30) Foreign Application Priority Data

Nov. 29, 2017   (KR) .................... 10-2017-0162161

(51) Int. Cl.

| | |
|---|---|
| H01L 21/00 | (2006.01) |
| H01L 27/146 | (2006.01) |
| H01L 27/12 | (2006.01) |
| H01L 27/32 | (2006.01) |
| G02F 1/1362 | (2006.01) |
| H01L 29/786 | (2006.01) |

(52) U.S. Cl.
CPC ...... *H01L 27/124* (2013.01); *G02F 1/136209* (2013.01); *H01L 27/127* (2013.01); *H01L 27/3272* (2013.01); *H01L 29/78633* (2013.01)

(58) Field of Classification Search
CPC ......... H01L 31/02164; H01L 29/78633; H01L 27/3272
USPC ...................... 257/340, 435–437; 438/69–72
See application file for complete search history.

(56) References Cited

U.S. PATENT DOCUMENTS

| | | |
|---|---|---|
| 7,378,291 B2 | 5/2008 | Yamazaki et al. |
| 7,547,563 B2 | 6/2009 | Yamazaki et al. |

(Continued)

FOREIGN PATENT DOCUMENTS

| | | |
|---|---|---|
| EP | 3 029 732 A1 | 6/2016 |
| EP | 3 240 038 A1 | 11/2017 |

(Continued)

OTHER PUBLICATIONS

European Patent Office, Extended European Search Report and Opinion, EP Patent Application No. 18208168.7, dated Apr. 1, 2019, eight pages.

(Continued)

*Primary Examiner* — Calvin Lee
(74) *Attorney, Agent, or Firm* — Fenwick & West LLP

(57) ABSTRACT

An organic light-emitting diode (OLED) device includes an active layer of a transistor disposed on the buffer insulating film. A gate insulating film is disposed on the buffer insulating film over the conducting layer and disposed on the active layer. A gate electrode is disposed on the gate insulating film over a channel region of the active layer. A first connecting pattern is disposed on the gate insulating film over the conducting line and the active layer. The first connecting pattern is connected to the conducting layer via a first connecting contact hole through the gate insulating film and the buffer insulating film. The first connecting pattern is also connected to the active layer via a second connecting contact hole through the gate insulating film. The first connecting pattern has a same material as the gate electrode.

12 Claims, 14 Drawing Sheets

(56) References Cited

U.S. PATENT DOCUMENTS

| | | |
|---|---|---|
| 8,003,981 B2 | 8/2011 | Iwasaki et al. |
| 8,197,052 B2 | 6/2012 | Yamazaki et al. |
| 8,425,016 B2 | 4/2013 | Yamazaki et al. |
| 8,752,940 B2 | 6/2014 | Yamazaki et al. |
| 9,262,964 B2 | 2/2016 | Nam et al. |
| 9,853,067 B2* | 12/2017 | Cai .................. G02F 1/136213 |
| 9,985,081 B2* | 5/2018 | Cho ........................ H01L 51/56 |
| 10,147,776 B2* | 12/2018 | Nam ..................... H01L 27/322 |
| 10,367,046 B2* | 7/2019 | Lee ..................... H01L 51/5228 |
| 10,461,268 B2* | 10/2019 | Jiang .................. H01L 51/5253 |
| 10,608,068 B2* | 3/2020 | Liu ..................... H01L 27/3265 |
| 2003/0008429 A1 | 1/2003 | Yamazaki et al. |
| 2007/0035225 A1 | 2/2007 | Lee et al. |
| 2008/0026501 A1 | 1/2008 | Yamazaki et al. |
| 2009/0065771 A1 | 3/2009 | Iwasaki et al. |
| 2009/0237467 A1 | 9/2009 | Yamazaki et al. |
| 2011/0062861 A1 | 3/2011 | Lee et al. |
| 2011/0256684 A1 | 10/2011 | Iwasaki et al. |
| 2012/0227664 A1 | 9/2012 | Yamazaki et al. |
| 2014/0132654 A1 | 5/2014 | Yamazaki et al. |
| 2015/0154908 A1 | 6/2015 | Nam et al. |
| 2016/0071891 A1 | 3/2016 | Oh et al. |
| 2016/0126258 A1 | 5/2016 | Liu et al. |
| 2016/0133682 A1 | 5/2016 | Kim et al. |
| 2017/0033171 A1 | 2/2017 | Kim et al. |
| 2019/0115561 A1* | 4/2019 | Tang .................. H01L 51/5228 |

FOREIGN PATENT DOCUMENTS

| | | |
|---|---|---|
| JP | 2003-022892 A | 1/2003 |
| JP | 2007-250983 A | 9/2007 |
| JP | 2016-213508 A | 12/2016 |
| JP | 2017-198992 A | 11/2017 |
| TW | 201208058 A | 2/2012 |
| TW | 201523564 A | 6/2015 |

OTHER PUBLICATIONS

Taiwan Intellectual Property Office, Tw Patent Application No. 107139450, dated May 30, 2019, six pages (with concise explanation of relevance).

Japan Patent Office, Notice of Reasons for Refusal, JP Patent Application No. 2018-217475, dated Sep. 24, 2019, six pages.

Taiwan Intellectual Property Office, Office Action, TW Patent Application No. 107139540, dated Sep. 26, 2019, ten pages (with concise explanation of relevance).

* cited by examiner

THIN-FILM TRANSISTOR ARRAY SUBSTRATE AND ORGANIC LIGHT-EMITTING DISPLAY DEVICE INCLUDING THE SAME

CROSS-REFERENCE TO RELATED APPLICATIONS

This application claims the priority of Korean Patent Application No. 10-2017-0162161 filed on Nov. 29, 2017, in the Korean Intellectual Property Office, the disclosure of which is hereby incorporated by reference in its entirety.

BACKGROUND

1. Technical Field

The present disclosure relates to a thin-film transistor array substrate including at least one thin-film transistor corresponding to each pixel region, and an organic light-emitting display device including the same.

2. Description of the Related Art

A display device is applied to various electronic devices such as TVs, mobile phones, notebooks and tablets. Researches for thinning, weight-saving and low-power consumption for the display device have been continued.

A typical example of the display device may include a liquid crystal display device (LCD), a plasma display device (PDP), a field emission display device (FED), an electroluminescence display device (ELD), an electro-wetting display device (EWD) and an organic light emitting display device (OLED).

The display panel may include a pair of substrates bonded to each other and a polarizing material or a light emitting material disposed between the pair of substrates.

In this connection, one of the pair of substrates may be a thin-film transistor array substrate. The thin-film transistor array substrate has a plurality of pixel regions defined within a display region in which an image is displayed and drives each pixel region. The thin-film transistor array substrate includes at least one thin-film transistor corresponding to each pixel region.

In a conventional thin-film transistor array substrate, the thin-film transistor includes an active layer existing in an island form, a gate electrode overlapping a portion of the active layer, and source and drain electrodes corresponding to both ends of the active layer.

Further, in order to reduce a leakage current from a channel corresponding to an overlapping region between the active layer and the gate electrode, the gate electrode may be disposed on a gate insulating-film covering at least a portion of the active layer.

In this case, during a patterning process to form the gate electrode, a remaining portion of the active layer that does not overlap the gate electrode is exposed to the patterning process. Thus, a predetermined amount of charges generated during the process may be charged to the active layer. In the state where the predetermined amount of charges have been charged, the active layer is vulnerable to an overcharge burst as caused by static electricity.

In particular, the greater a width of the active layer, the greater the amount of charges charged in the active layer. As a result, the overcharge burst may occur more easily, thereby causing defective spots.

SUMMARY

The present disclosure is intended to provide a thin-film transistor array substrate capable of preventing the overcharge burst of the active layer due to the static electricity, and to provide an organic light-emitting display device including the same.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

An embodiment comprises an organic light-emitting diode (OLED) device including a substrate, a conducting layer disposed on the substrate, and a buffer insulating film disposed on the conducting layer. An active layer of a transistor is disposed on the buffer insulating film. A gate insulating film is disposed on the buffer insulating film over the conducting layer and disposed on the active layer. A gate electrode is disposed on the gate insulating film over a channel region of the active layer. A first connecting pattern is disposed on the gate insulating film over the conducting line and the active layer. The first connecting pattern is connected to the conducting layer via a first connecting contact hole through the gate insulating film and the buffer insulating film. The first connecting pattern is also connected to the active layer via a second connecting contact hole through the gate insulating film. The first connecting pattern has a same material as the gate electrode.

In an embodiment, the transistor comprises a switching transistor of a pixel, the conducting layer comprises a data line to provide a data voltage to a pixel, and the gate electrode comprises a scan line to drive the switching transistor.

In another embodiment, the transistor comprises a driving transistor to drive a light-emitting diode of a pixel, wherein the gate electrode comprises a driving transistor gate electrode to drive the driving transistor, and wherein the conducting layer comprises a light blocking pattern to block light of the light-emitting diode.

In another embodiment, the transistor comprises a sensing transistor to sense a voltage to a light-emitting diode of a pixel, wherein the gate electrode comprises a sensing line to drive the sensing transistor, and wherein the conducting layer comprises a light blocking pattern to block light of the light-emitting diode.

In an embodiment, a light blocking pattern is disposed on the substrate that has a same material as the data line. The overlapping regions of the active layer of the switching transistor and the light blocking pattern respectively comprise a first electrode and a second electrode of a storage capacitor of the pixel with the buffer insulating film disposed in between.

In an embodiment, the OLED display device further includes an active layer of a driving transistor disposed on the buffer insulating film. An active layer of a sensing transistor is disposed on the buffer insulating film. The active layer of the switching transistor has a larger area than the active layer of the driving transistor and the sensing transistor.

In an embodiment, the OLED display device further comprises a reference voltage line disposed on the substrate. An active layer of a sensing transistor is disposed on the buffer insulating film. The gate insulating film is further disposed on the active layer of the sensing transistor. A sense line on the gate insulating film overlaps a channel region of the active layer of the sensing transistor. A second connecting pattern is disposed on the gate insulating film. The second connecting pattern is connected to the reference voltage line via a third connecting contact hole through the gate insulating film and the buffer insulating film. The second connecting pattern is connected to a source region of the active layer of the sensing transistor via a fourth connecting contact hole through the gate insulating film.

In an embodiment, the OLED display device further comprises a light blocking pattern disposed on the substrate. The buffer insulating film is disposed on the light blocking pattern. The gate insulating film is disposed on the buffer insulating film overlapping the light blocking pattern. A third connecting pattern is disposed on the gate insulating film. The third connecting pattern is connected to the light blocking pattern via a fifth connecting contact hole through the gate insulating film and the buffer insulating film. The third connecting pattern is connected to a drain region of the active layer of the sensing transistor via a sixth connecting contact hole through the gate insulating film.

In another aspect, a manufacturing method is provided for manufacturing an organic light emitting diode (OLED) display device. A conducting layer is formed on a substrate. A buffer insulating film is formed on the conducting layer. An active layer of a transistor is formed on the buffer insulating film. A gate insulating film is formed on the buffer insulating film over the conducting layer and is formed on the active layer of the transistor. A first connecting contact hole is formed through the gate insulating film and the buffer insulating film to expose the conducting layer. A second connecting contact hole is formed through the gate insulating film to expose the active layer of the transistor. A gate electrode is formed on the gate insulating film over a channel region of the active layer of the transistor. Concurrently with forming the gate electrode, a first connecting pattern is formed on the gate insulating film. The first connecting pattern connects to the conducting layer via the first connecting contact hole. The first connecting pattern also connects to the active layer of the transistor via the second connecting contact hole.

In an embodiment, the transistor comprises a switching transistor of a pixel, the conducting layer comprises a data line to provide a data voltage to the pixel, and the gate electrode comprises a scan line to drive the switching transistor.

In an embodiment, a light blocking pattern is further formed on the substrate concurrently with forming the data line. Overlapping regions of the active layer of the switching transistor and the light blocking pattern respectively comprise a first electrode and a second electrode of a storage capacitor of the pixel with the buffer insulating film disposed in between.

In an embodiment, a reference voltage line is formed on the substrate. An active layer of a sensing transistor is formed on the buffer insulating film. The gate insulating film is further formed on the active layer of the sensing transistor. A sense line is formed on the gate insulating film over a channel region of the active layer of the sensing transistor. A third connecting contact hole is formed through the gate insulating film and the buffer insulating film to expose the reference voltage line. A fourth connecting contact hole is formed through the gate insulating film to expose a source region of the active layer of the sensing transistor. A second connecting pattern is formed on the gate insulating film connecting to the reference voltage line via the third connecting contact hole, and connecting to the source region of the active layer of the sensing transistor via the fourth connecting contact hole.

In an embodiment, a light blocking pattern is formed on the substrate. The buffer insulating film is further formed on the light blocking pattern. The gate insulating film is further formed on the buffer insulating film over the light blocking pattern. A fifth connecting contact hole is formed through the gate insulating film and the buffer insulating film to expose the light blocking pattern. A sixth connecting contact hole is formed through the gate insulating film to expose a drain region of the active layer of the sensing transistor. A third connecting pattern is formed on the gate insulating film connecting to the light blocking pattern via the fifth connecting contact hole and connecting to the drain region of the active layer of the sensing transistor via the sixth connecting contact hole.

DETAILED DESCRIPTION

Figure 1:
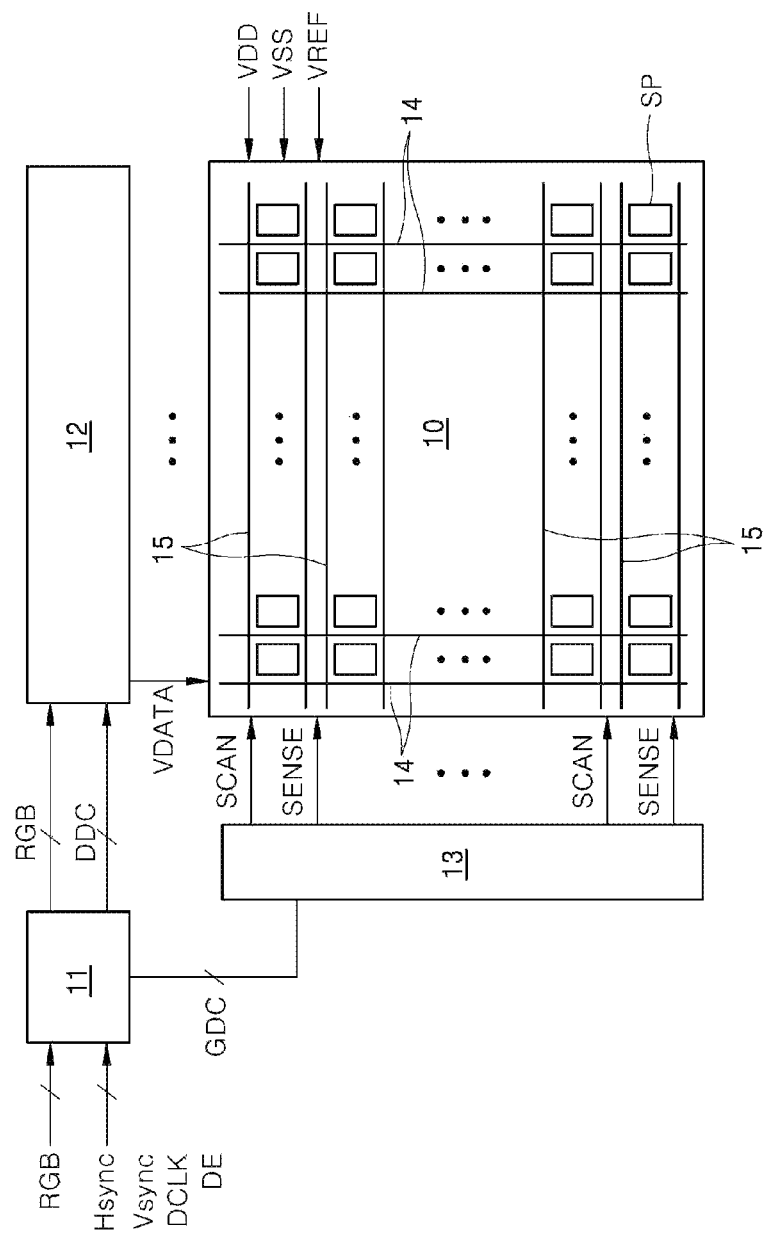
FIG. 1 shows an organic light-emitting display device according to one embodiment of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for describing particular embodiments only and is not intended to be limiting of the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a thin-film transistor array substrate according to various embodiments of the present disclosure and an organic light-emitting display device including the same will be described in detail with reference to the accompanying drawings.

First, referring to FIGS. 1 to 5, a thin-film transistor array substrate according to one embodiment of the present disclosure and an organic light-emitting display device including the same will be described.

Figure 2:
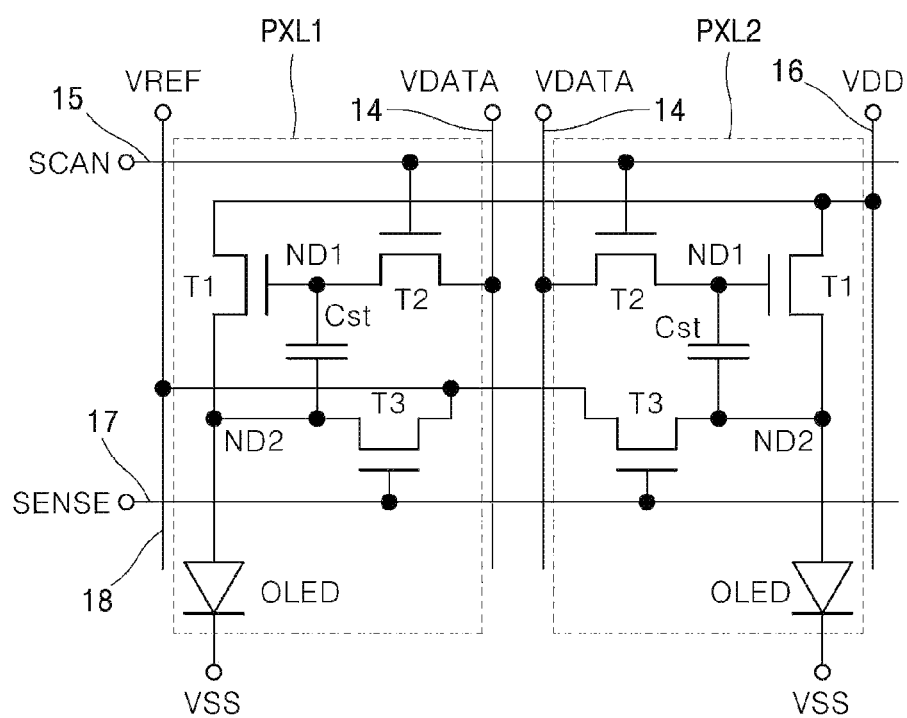
FIG. 2 shows one example of an equivalent circuit to each pixel region in FIG. 1.
Figure 3:
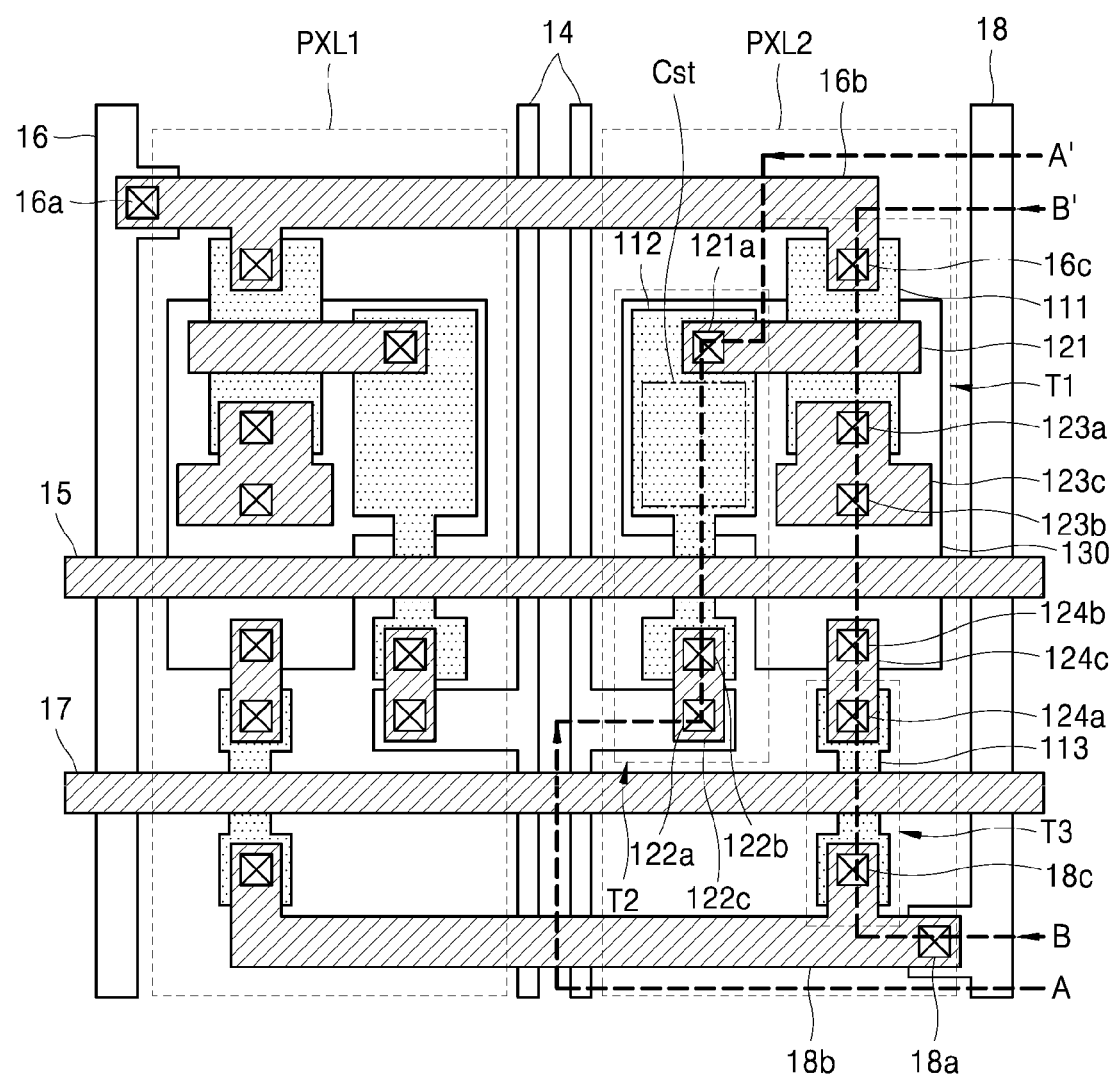
FIG. 3 shows one example of a plane of a thin-film transistor array substrate corresponding to the equivalent circuit of FIG. 2.
Figure 4:
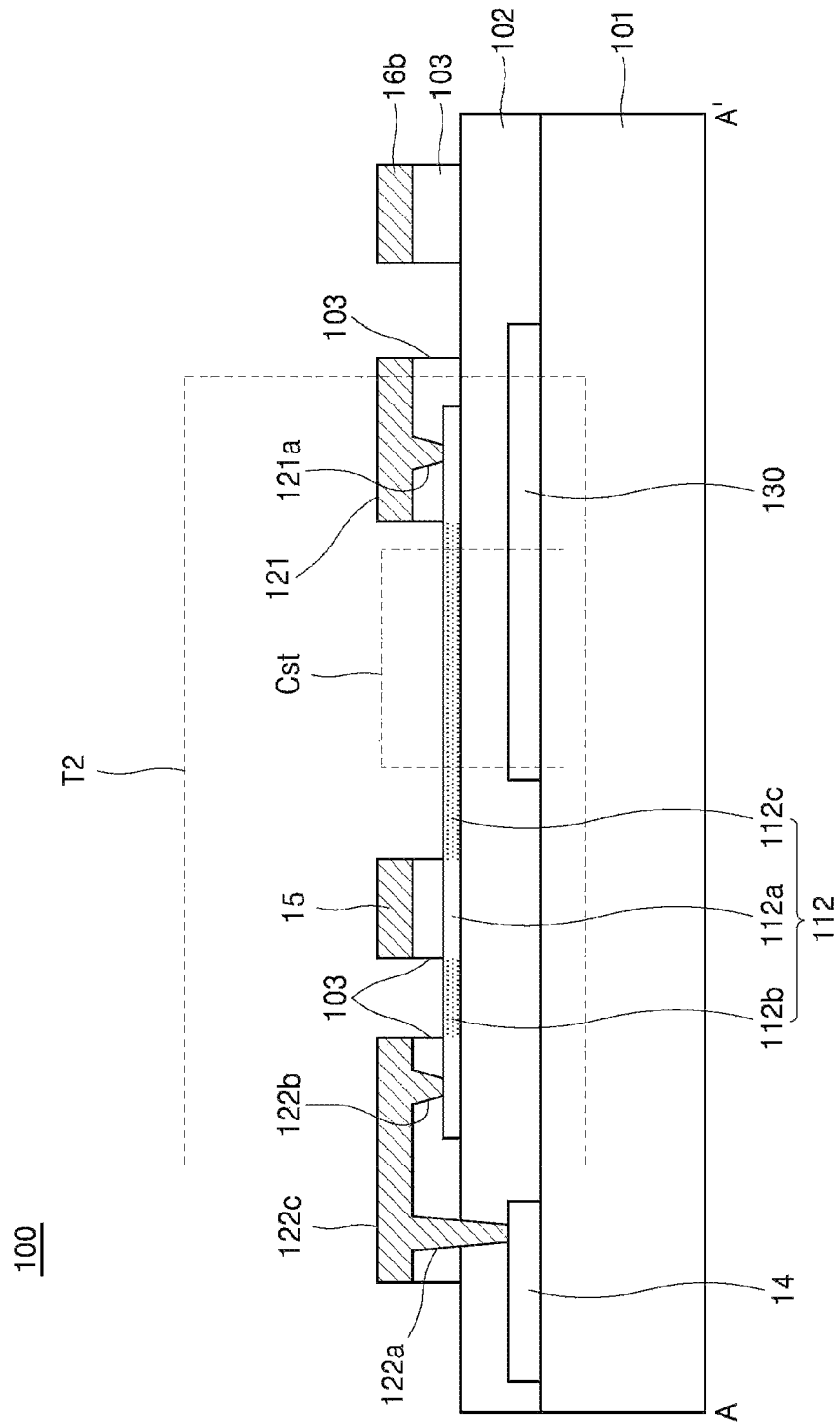
FIG. 4 shows a cross-section taken in a line A-A' of FIG. 3.
Figure 5:
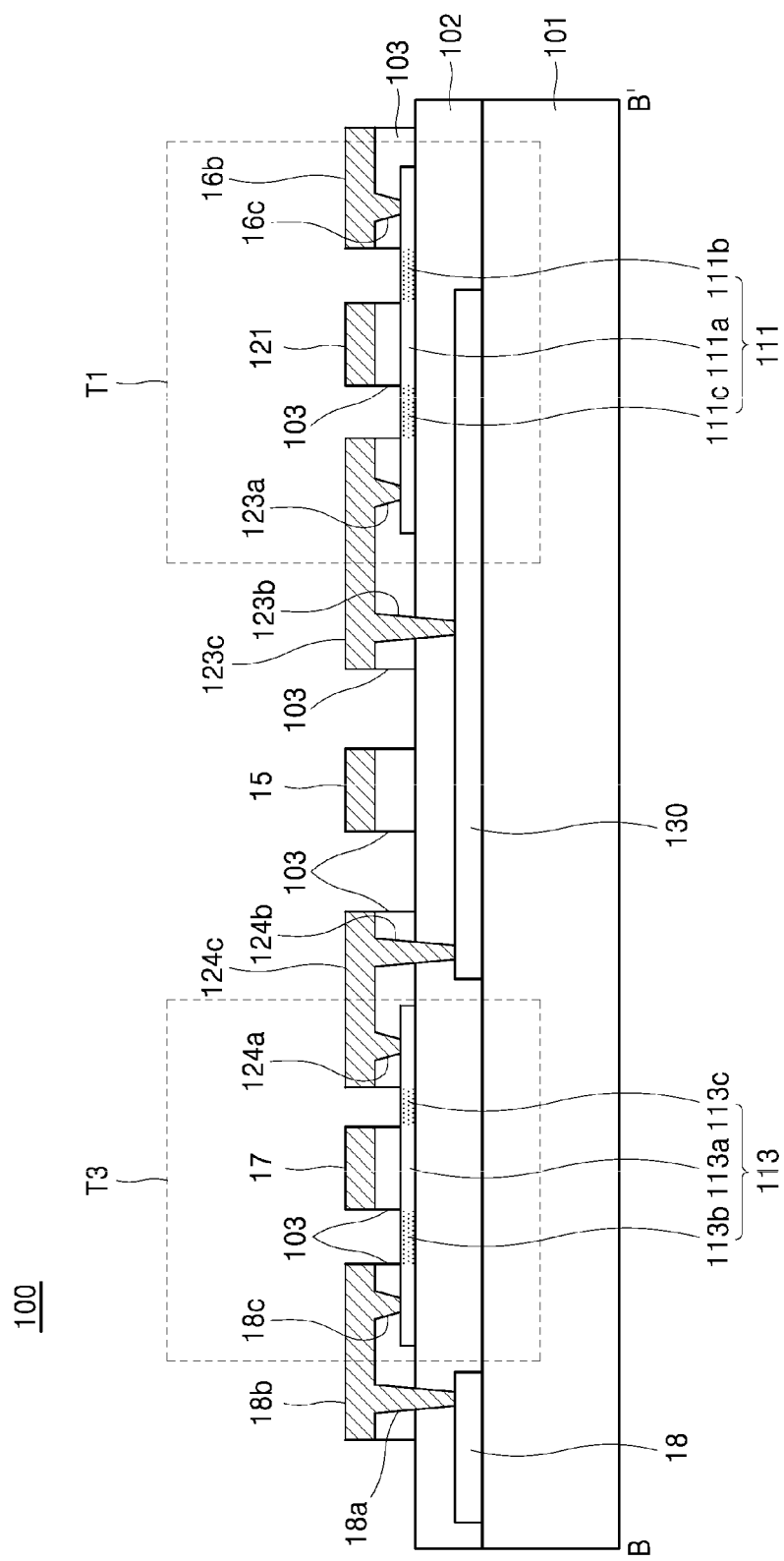
FIG. 5 shows a cross-section taken in a line B-B' of FIG. 3.

FIG. 1 shows an organic light-emitting display device according to one embodiment of the present disclosure. FIG. 2 shows one example of an equivalent circuit to each pixel region in FIG. 1. FIG. 3 shows one example of a plane of a thin-film transistor array substrate corresponding to the equivalent circuit of FIG. 2. FIG. 4 shows a cross-section taken in a line A-A' of FIG. 3. FIG. 5 shows a cross-section taken in a line B-B' of FIG. 3.

As shown in FIG. 1, the organic light-emitting display device according to one embodiment of the present disclosure includes a display panel 10 including a plurality of pixel regions PXLs arranged in a matrix within a display region in which images are displayed; a data drive unit 12 for driving data-lines 14 of the display panel 10, a gate drive unit 13 for driving scan-lines 15 of the display panel 10, and a timing controller 11 for controlling a driving timing of each of the data drive unit 12 and the gate drive unit 13.

Further, the display panel 10 includes scan-lines 15, each corresponding to each horizontal line including pixel regions PXLs arranged in a row in a horizontal direction, and data-lines 14, each corresponding to a vertical line including pixel regions PXLs arranged in a column in a vertical direction. The plurality of pixel regions PXLs may be defined by intersecting scan-lines 15 and data-lines 14, and thus may be arranged in a matrix form within the display region AA.

Further, the display panel 10 includes a first power supply line for supplying a first drive voltage VDD to the plurality of pixel regions PXLs, a second power supply line for supplying a second drive voltage VSS lower than the first drive voltage VDD to the plurality of pixel regions PXLs, and a reference power supply line for supplying a reference voltage VREF to the plurality of pixel regions PXLs.

The timing controller 11 rearranges digital video data RGB input from the outside according to a resolution of the display panel 10 and supplies the rearranged digital video data RGB' to the data drive unit 12.

Further, the timing controller 11 generates and supplies a data control signal DDC for controlling an operation timing of the data drive unit 12 and a gate control signal GDC for controlling an operation timing of the gate drive unit 13, based on timing signals such as a vertical synchronization signal Vsync, a horizontal synchronization signal Hsync, a dot clock signal DCLK, and a data enable signal DE.

The data drive unit 12 converts the rearranged digital video data RGB' into an analog data voltage based on the data control signal DDC. Further, the data drive unit 12 supplies a data signal VDATA to pixel regions corresponding to each horizontal line via the data-line 15 for each horizontal period, based on the rearranged digital video data RGB'.

The gate drive unit 13 generates and supplies a scan signal SCAN and a sense signal SENSE based on the gate control signal GDC.

Although not separately shown, the display panel 10 includes a pair of substrates bonded together facing each other and an organic light-emitting elements array disposed therebetween. Further, one of the pair of substrates may be implemented as a thin-film transistor array substrate. The thin-film transistor array substrate has a plurality of pixel regions PXLs defined therein and supplies a driving current to an organic light-emitting element in each pixel region PXL.

Each of the pixel regions PXLs includes an organic light-emitting element OLED, a storage capacitor Cst, a first thin film transistor T1, a second thin film transistor T2, and a third thin film transistor T3.

The organic light-emitting element OLED includes an anode and a cathode, and an organic light-emitting layer (not shown) disposed therebetween. In one example, the organic light-emitting layer includes a hole injection layer, a hole transport layer, a light emitting layer, and an electron transport layer. Alternatively, the organic light-emitting layer may further include an electron injection layer.

The first thin-film transistor T1 is disposed between the first power supply line 16, which supplies the first drive voltage VDD, and the second power supply line, which supplies the second drive voltage VSS below the first drive voltage VDD. The first thin-film transistor T1 is connected in series with the organic light-emitting element OLED.

The second thin-film transistor T2 is disposed between the data-line 14 and the first thin-film transistor T1. When the second thin-film transistor T2 is turned on based on the scan signal SCAN from the scan-line 15, a data signal VDATA is applied to a first node ND1 between a gate electrode of the first thin-film transistor T1 and the second thin-film transistor T2.

The storage capacitor Cst is disposed between the first node ND1 and a second node ND2. The second node ND2 is a contact point between the first thin-film transistor T1 and the organic light-emitting element OLED.

The storage capacitor Cst is charged based on the data signal VDATA supplied to the first node ND1 via the second thin-film transistor T2 as is turned on.

The third thin-film transistor T3 is disposed between the reference power supply line 18 for supplying the reference voltage VREF and the second node ND2. When the third thin-film transistor T3 is turned on based on the sense signal SENSE from the sense line 17 corresponding to each horizontal line, the second node ND2 is supplied with the reference voltage VREF, or a voltage from the second node ND2 is delivered to the reference power supply line 18.

As shown in FIG. 3, the thin-film transistor array substrate 100 of the organic light-emitting display device according to one embodiment of the present disclosure includes first, second, and third thin-film transistors T1, T2 and T3, and a storage capacitor.

Further, the thin-film transistor array substrate 100 further includes a scan-line 15 and a sense-line 17, both extending in a first direction (a horizontal direction in FIG. 3) and a data-line 14, a first power supply line 16, and a reference power supply line 18, all extending in a second direction (a vertical direction in FIG. 3).

In this connection, each data-line 14 may correspond to each vertical line, while each of the first power supply line 16 and the reference power supply line 18 may correspond to more than one vertical line.

The thin-film transistor array substrate 100 includes a first connecting pattern 16b and a second connecting pattern 18b. The first connecting pattern 16b is connected to the first power supply line 16 via a first connecting contact-hole 16a and extends in a horizontal direction to a pixel region PXL2 not adjacent to the first power supply line 16. The second connecting pattern 18b is connected to the reference power supply line 18 via a second connecting contact-hole 18a and extends in a horizontal direction to a pixel region PXL1 that is not adjacent to the reference power supply line 18.

The first thin-film transistor T1 includes an active layer 111 and a gate electrode 121 overlapping a portion of the active layer 111.

The active layer 111 of the first thin-film transistor T1 includes a channel region overlapping the gate electrode 121, and a source region and a drain region respectively disposed at both ends of the channel region.

One of the source region and the drain region of the active layer 111 of the first thin-film transistor T1 is connected to the first power supply line 16 via the first connecting pattern 16b, while the other thereof is connected to the second node (ND2 in FIG. 2) between the organic light-emitting element (OLED in FIG. 2) and the third thin-film transistor T3.

Further, the gate electrode 121 of the first thin-film transistor T1 is connected to the second thin-film transistor T2.

The second thin-film transistor T2 includes an active layer 112 and a gate electrode defining a portion of the scan-line 15 overlapping the active layer 112.

The active layer 112 of the second thin-film transistor T2 includes a channel region overlapping a gate electrode defining a portion of the scan-line 15, and source and drain regions respectively disposed at both ends of the channel region. In this connection, one of the source region and the drain region of the active layer 112 of the second thin-film transistor T2 is connected to the data-line 14 via first and second connecting contact-holes 122a and 122b and a connecting pattern 122c, while the other thereof is connected to the gate electrode 121 of the first thin-film transistor T1.

The third thin-film transistor T3 includes an active layer 113 and a gate electrode defining a portion of the sense-line 17 overlapping the active layer 113.

The active layer 113 of the third thin-film transistor T3 includes a channel region overlapping a gate electrode defining a portion of the sense-line 17, and a source region and a drain region disposed at both ends of the channel region, respectively. In this connection, one of the source region and the drain region of the active layer 113 of the third thin-film transistor T3 is connected to the reference power supply line 18 via a second connecting pattern 18b, while the other thereof is connected to the second node (ND2 in FIG. 2) between the organic light-emitting element (OLED in FIG. 2) and the first thin-film transistor T1.

The first thin-film transistor T1 may be configured to supply the driving current to the organic light-emitting element OLED. In this regard, when a leakage current occurs from the first thin-film transistor T1, this may cause a malfunction of the organic light-emitting element OLED, which may lead to poor image quality.

Therefore, the thin-film transistor array substrate 100 includes a light-blocking pattern 130 overlapped on the channel region in the active layer 111 of the first thin-film transistor T1 overlapping with the gate electrode 121 of the first thin-film transistor T1 in order to prevent the leakage current from the first thin-film transistor T1 due to light-beams.

The light-blocking pattern 130 is disposed more adjacent to the substrate (101 in FIG. 4) than the active layer 111 of the first thin-film transistor T1. The light-blocking pattern is overlapped at least on the channel region in the active layer 111 of the first thin-film transistor T1.

Further, the light-blocking pattern 130 acts as a first capacitor electrode of the storage capacitor (Cst in FIG. 2) connected to the second node ND2 between the first and third thin-film transistors T1 and T3 and the organic light-emitting element OLED.

Further, one of the source region and the drain region of the active layer 112 of the second thin-film transistor T2 is connected to the first thin-film transistor T1. Said one acts as a second capacitor electrode of the storage capacitor (Cst in FIG. 2) connected to the first node ND2 between the first and second thin-film transistors T1 and T2.

That is, in the overlap region between the light-blocking pattern 130 and the active layer 112 of the second thin-film transistor T2, the storage capacitor Cst is positioned.

In order to stably drive each organic light-emitting element OLED during each image frame, the storage capacitor Cst needs to have a capacitance higher than a threshold value.

In order to secure the capacity of the storage capacitor Cst, it is necessary to increase the overlap region between the active layer 112 of the second thin-film transistor T2 and the light-blocking pattern 130. Thus, the active layer 112 of the second thin-film transistor T2 may have a larger area than that of each of the active layers 111 and 113 of the other thin-film transistors T1 and T3.

Further, in order to reduce the leakage current from each of the active layers 111, 112 and 113, each of the gate electrodes 121, 15 and 17 of the thin-film transistors T1, T2 and T3 may be disposed on each of gate insulating-films covering at least portions of the active layers 111, 112 and 113.

That is, a patterning process for forming the gate electrode is performed in a state where each of the active layers 111, 112 and 113 has been formed in an island shape. Accordingly, a predetermined amount of charges may be charged to the active layers 111, 112 and 113 as is exposed to the patterning process.

Particularly, among the active layers 111, 112 and 113, the active layer 112 of the second thin-film transistor T2 for defining the storage capacitor Cst has the widest width. As a result, a large amount of charges may be charged into the active layer 112 of the second thin-film transistor T2, which, thus, may be vulnerable to an overcharge burst due to static electricity.

To solve this problem, in the thin-film transistor array substrate 100 in accordance with one embodiment of the present disclosure, the data-line 14 may be formed prior to formation of the active layer 112 of the second thin-film transistor T2. Further, during the patterning process for forming the gate electrode, a connecting pattern 122c connecting the active layer 112 of the second thin-film transistor T2 and the data-line 14 may be formed.

That is, in the patterning process for forming the gate electrode, the active layer 112 of the thin film transistor T2 is connected to the data line 14 via the connecting pattern 122c. Therefore, during the patterning process for forming the gate electrode, charges charged into the active layer 112 may be discharged via the data line 14, which may suppress an overcharge burst due to static electricity.

Specifically, as shown in FIG. 4, the thin-film transistor array substrate 100 according to one embodiment of the present disclosure may include the data-line 14 and the light-blocking pattern 130 disposed on the substrate 101; the active layer 112 of the second thin-film transistor T2 disposed on a buffer insulating-film 102 covering the data-line 14 and the light-blocking pattern 130; the gate insulating-film 103 disposed on the buffer insulating-film 102 and covering the data-line 14 and at least a portion of the active layer 112 of the second thin-film transistor T2; the first connecting contact-hole 122a passing through the buffer insulating-film 102 and the gate insulating-film 103 and disposing on a portion of the data-line 14; the second connecting contact-hole 122b passing through the gate insulating-film 103 and disposing on a portion of the active layer 112 of the second thin-film transistor T2; and the connecting pattern 122c disposed on the gate insulating-film 103 and connecting the data-line 14 to the active layer 112 of the second thin-film transistor T2 via the first and second connecting contact-holes 122a and 122b.

Further, the thin-film transistor array substrate 100 further includes the scan-line 15 disposed on the gate insulating-film 103. In this connection, a portion of the scan-line 15 overlaps a portion of the active layer 112 of the second thin-film transistor T2, and, thus, act as the gate electrode of the second thin-film transistor T2.

The active layer 112 of the second thin-film transistor T2 is disposed on the buffer insulating-film 102, and includes a channel region 112a overlapped with the gate electrode defining a portion of the scan-line 15, and a source region 112b and a drain region 112c disposed respectively at both ends of the channel region 112a.

In this connection, one (source region 112b in FIG. 4) of the source region 112b and the drain region 112c of the active layer 112 of the second thin-film transistor T2 is connected via the first and second connecting contact-holes 122a and 122b and the connecting pattern 122c to the data-line 14 on the substrate 101, while the other (drain region 112c of FIG. 4) thereof is connected to the gate electrode 121 of the first thin-film transistor T1 via a gate electrode contact-hole 121a passing through the gate insulating-film 103.

Further, the active layer 112 of the second thin-film transistor T2 may include an oxide semiconductor material. In this case, each of the source region 112b and drain region 112c of the active layer 112 of the second thin-film transistor T2 may made of a conducting oxide semiconductor material which may be formed via exposure to an etchant during a patterning process to form the scan-line 15 and the first connecting pattern 16b disposed on the gate insulating-film 103.

The first connecting pattern 16b, which is connected to the first power supply line 16, is disposed on the gate insulating-film 103.

Although not separately shown, the first power supply line 16 may be disposed on the substrate 101 together with the data-line 14 and covered with the buffer insulating-film 102. In this case, the first connecting pattern 16b may be connected to the first power supply line 16 via the first connecting contact-hole 16a passing through the buffer insulating-film 102 and the gate insulating-film 103.

Unlike the data-line 14, the first power supply line 16 may be disposed on an interlayer insulating-film (not shown) covering the gate electrode 121, the connecting pattern 122c, the scan-line 15, the sense-line 17, and the first connecting pattern 16b, etc. In this case, the first connecting contact-hole 16a may pass through the interlayer insulating-film and dispose on a portion of the first connecting pattern 16b.

In this manner, according to one embodiment of the present disclosure, the active layer 112 of the second thin-film transistor T2 may be connected to the data-line 14 via the connecting pattern 122c arranged at the same vertical level as the scan-line 15. Thus, charges that has been charged into the active layer 112 of the second thin-film transistor T2 may be discharged via the data-line 14 while the patterning process to form the scan-line 15 is performed. Therefore, configuring the active layer 112 of the second thin-film transistor T2 having a relatively large area may ensure the capacity of the storage capacitor Cst, while a large amount of charges exceeding the threshold value may be prevented from being charged into the active layer 112 of the second thin-film transistor T2. As a result, the active layer 112 of the second thin-film transistor T2 may be free of the overcharge-burst by static electricity.

In addition, as shown in FIG. 5, the thin-film transistor array substrate 100 according to one embodiment of the present disclosure may further include the reference power supply line 18 disposed on the substrate 101 and covered with the buffer insulating-film 102, the active layers 111 and 113 of the first and third thin-film transistors T1 and T3 disposed on the buffer insulating-film 102, and the second connecting pattern 18b, the sense-line 17, first and second connecting patterns 123c and 124c disposed on the gate insulating-film 103.

The reference power supply line 18 may be disposed on the substrate 101 together with the data-line 14 and may be covered with the buffer insulating-film 102. In this case, the second connecting pattern 18b disposed on the gate insulating-film 103 may be connected to the reference power supply line 18 via the second connecting contact-hole 18a passing through the buffer insulating-film 102 and the gate insulating-film 103.

However, this is only an example. In another example, the reference power supply line 18 may be formed on an interlayer insulating-film (not shown) covering the gate electrode 121, the connecting pattern 122c, the scan-line 15, the sense-line 17 and the first connecting pattern 16b, etc. In this case, the second connecting contact-hole 18a may penetrate the interlayer insulating-film and dispose on the portion of the second connecting pattern 18b.

The active layer 111 of the first thin-film transistor T1 is disposed on the buffer insulating-film 102. The active layer 111 of the first thin-film transistor T1 includes the channel region 111a overlapping the gate electrode 121, and the source region 111b and the drain region 111c respectively disposed on both ends of the channel region 111a.

In this connection, the gate electrode 121 of the first thin-film transistor T1 is disposed on the gate insulating-film 103 covering a portion of the active layer 111. The gate electrode 121 of the first thin-film transistor T1 is connected to the second thin-film transistor T2 via the gate electrode contact-hole (121a in FIG. 4).

One (source region 111b of FIG. 5) of the source region 111b and the drain region 111c of the active layer 111 of the first thin-film transistor T1 is connected to the first power supply line 16 via the first connecting pattern 16a, while the other (drain region 111c of FIG. 5) thereof is connected to the light-blocking pattern 130 on the substrate 101 via first and second connecting contact-holes 123a and 123b and the first connecting pattern 123c.

Further, the active layer 111 of the first thin-film transistor T1 may include an oxide semiconductor material. In this case, each of the source region 111b and drain region 111c of the active layer 111 of the first thin-film transistor T1 may include a conducting oxide semiconductor material. The conducting oxide semiconductor material may be formed via exposure to the etchant during a patterning process to form the scan-line 15 and the first connecting pattern 16b, etc. disposed on the gate insulating-film 103.

The active layer 113 of the third thin-film transistor T3 is disposed on the buffer insulating-film 102. The active layer 113 of the third thin-film transistor T3 includes a channel region 113a overlapping a gate electrode defining a portion of the sense-line 17, and a source region 113b and a drain region 113c respectively disposed on both ends of the channel region 113a.

In this connection, one (source region 113b in FIG. 5) of the source region 113b and the drain region 113c of the active layer 113 of the third thin-film transistor T3 is connected to the reference power supply line 18 via the second connecting pattern 18a, while the other (drain region 113c of FIG. 5) thereof is connected to the light-blocking pattern 130 on the substrate 101 via third and fourth connecting contact-holes 124a and 124b and the second connecting pattern 124c.

Further, the active layer 113 of the third thin-film transistor T3 may include an oxide semiconductor material. In this case, each of the source region 113b and drain region 113c of the active layer 113 of the third thin-film transistor T3 may include a conducting oxide semiconductor material. The conducting oxide semiconductor material may be formed via exposure to the etchant during a patterning process to form the scan-line 15 and the first connecting pattern 16b, etc. disposed on the gate insulating-film 103.

The first connecting pattern 16b is connected to the active layer 111 of the first thin-film transistor T1 via a third connecting contact-hole 16c passing through the gate insulating-film 103.

The first thin-film transistor T1 is connected to the first power supply line 16 via the first connecting pattern 16b.

The first connecting pattern 123c is connected to the light-blocking pattern 130 via the first connecting contact-hole 123a passing through the buffer insulating-film 102 and the gate insulating-film 103. The first connecting pattern 123c is connected to the active layer 111 of the first thin-film transistor T1 via the second connecting contact-hole 123c passing through the gate insulating-film 103.

The second connecting pattern 124c is connected to the third thin-film transistor T3 via the third connecting contact-hole 124a passing through the gate insulating-film 103. The second connecting pattern 124c is connected to the light-blocking pattern 130 via the fourth connecting contact-hole 124b passing through the buffer insulating-film 102 and the gate insulating-film 103.

The first and third thin-film transistors T1 and T3 are interconnected via the first and second connecting patterns 123c and 124c and the light-blocking pattern 130.

The second connecting pattern 18b is connected to the active layer 113 of the third thin-film transistor T3 via the fourth connecting contact-hole 18c passing through the gate insulating-film 103.

The third thin-film transistor T3 is connected to the reference power supply line 18 via the second connecting pattern 18b.

Hereinafter, a method for manufacturing a thin-film transistor array substrate according to one embodiment of the present disclosure will be described.

Figure 6:
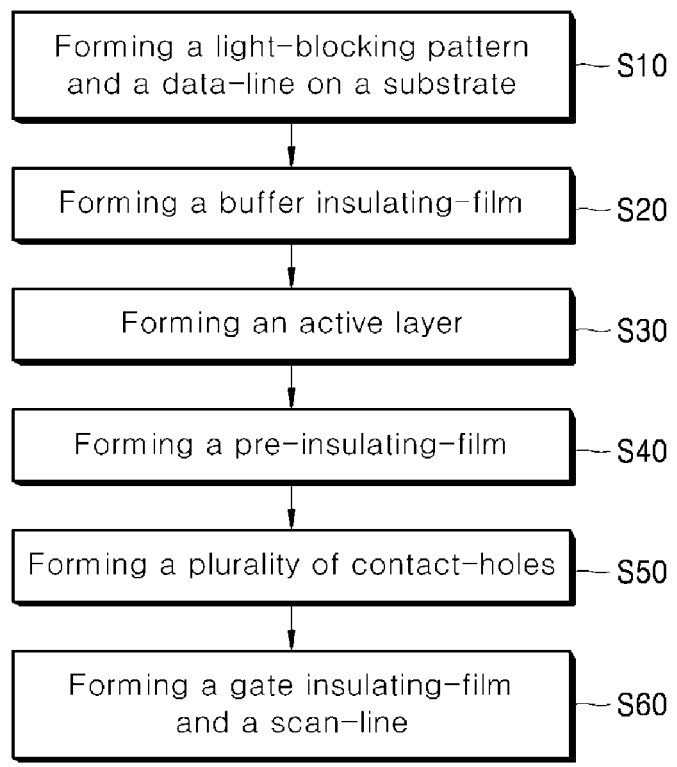
FIG. 6 shows a method for fabricating a thin-film transistor array substrate according to one embodiment of the present disclosure.

FIG. 6 shows a method for fabricating a thin-film transistor array substrate according to one embodiment of the present disclosure. FIG. 7 to FIG. 14 show structures corresponding to method steps of FIG. 6, respectively.

As shown in FIG. 6, a method for manufacturing a thin-film transistor array substrate according to one embodiment of the present disclosure includes a step S10 of forming a light-blocking pattern and a data-line on a substrate; a step S20 of forming a buffer insulating-film covering the light-blocking pattern and the data-line; a step S30 of forming an active layer of each thin-film transistor on the buffer insulating-film; a step S40 of forming at least a pre-insulatingfilm covering the buffer insulating-film and the active layer; a step S50 of forming a plurality of contact-holes passing through at least the pre-insulating-film among the buffer insulating-film and pre-insulating-film; and a step S60 of forming a gate insulating-film and a scan-line by patterning the pre-insulating-film and a conductive film on the pre-insulating-film.

Figure 7:
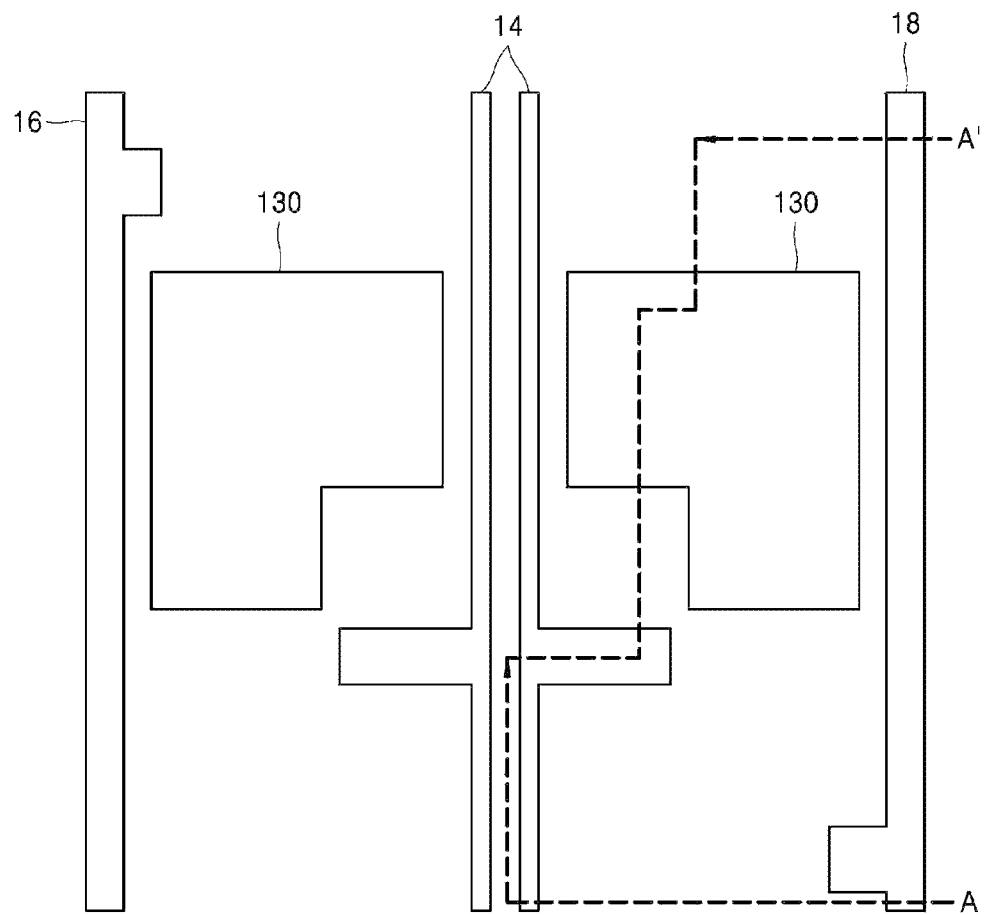
FIG. 7 illustrates a plane of a structure of a thin-film transistor array substrate formed during a manufacturing method according to one embodiment of the present disclosure.
Figure 8:
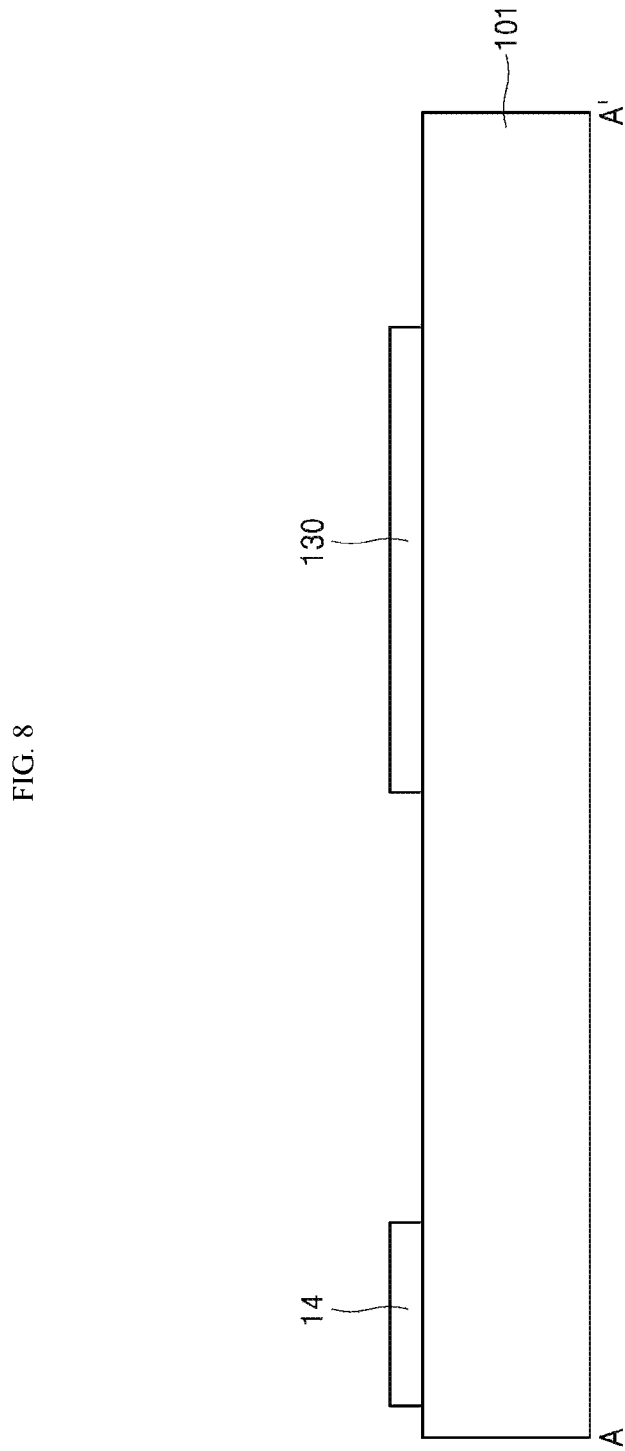
FIG. 8 illustrates a cross-section of a structure of a thin-film transistor array substrate formed during a manufacturing method according to one embodiment of the present disclosure.

As shown in FIGS. 7 and 8, the light-blocking pattern 130 and the data-line 14 are formed on the substrate 101 (S10).

In this connection, the light-blocking pattern 130 corresponds to the portion of each pixel region PXL. In one example, the light-blocking pattern 130 may be overlapped with the channel region (111a in FIG. 5) in the active layer 111 of the first thin-film transistor (T1 in FIG. 3), and with the drain region (112C in FIG. 4) in the active layer 112 of the second thin-film transistor (T2 in FIG. 3).

The data-line 14 may correspond to each vertical line including pixel regions arranged in a vertical direction among a plurality of pixel regions PXLs, and may extend in a vertical direction.

In this regard, two or more vertical lines may correspond to each of the first power supply line 16 and the reference power supply line 18. Each of the first power supply line 16 and the reference power supply line 18 may be disposed on the substrate 101, together with the light-blocking pattern 130 and the data-line 14.

Figure 9:
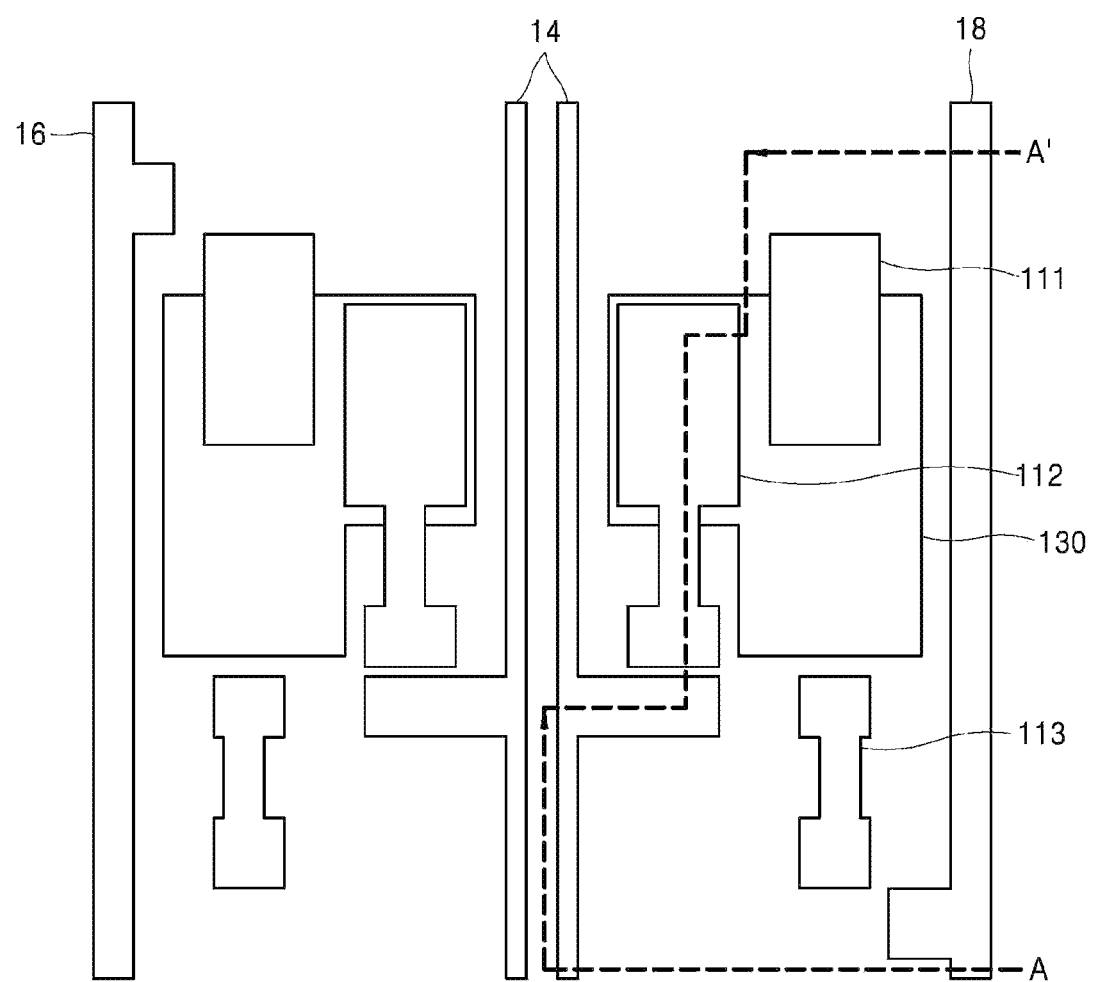
FIG. 9 illustrates a plane of a structure of a thin-film transistor array substrate formed during a manufacturing method according to one embodiment of the present disclosure.
Figure 10:
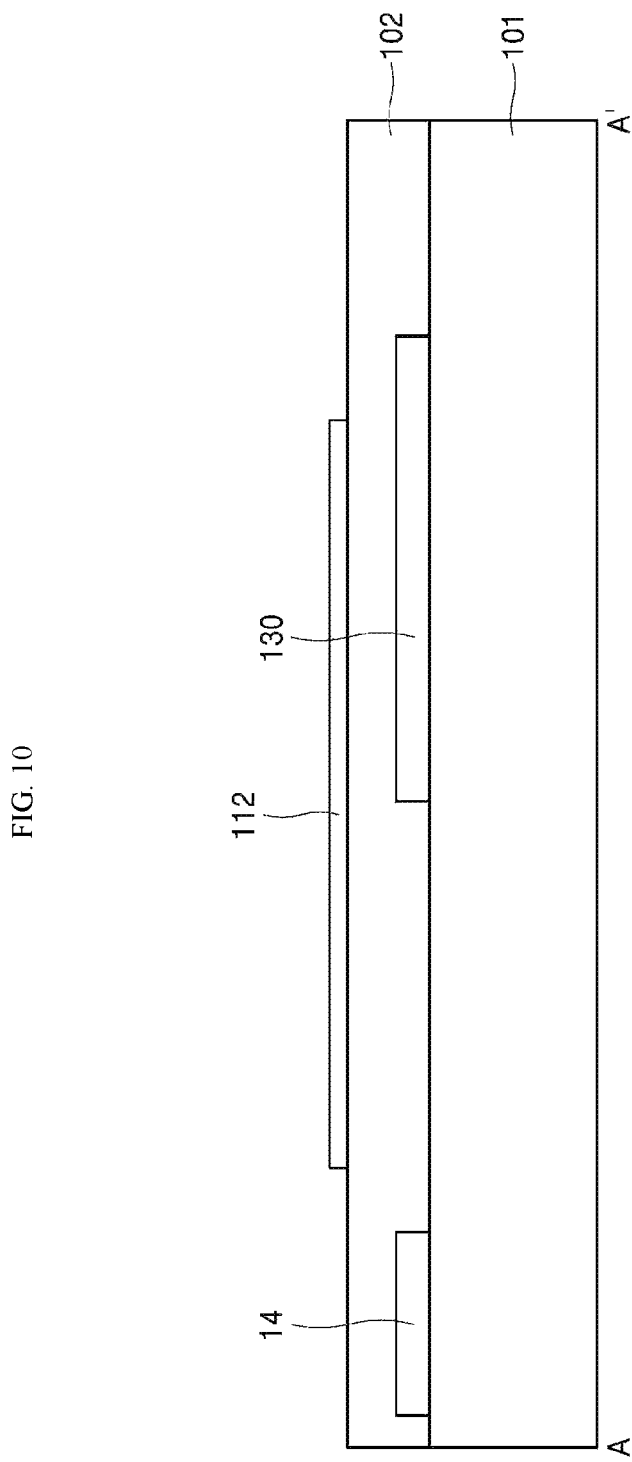
FIG. 10 illustrates a cross-section of a structure of a thin-film transistor array substrate formed during a manufacturing method according to one embodiment of the present disclosure.

As shown in FIG. 9 and FIG. 10, the buffer insulating-film 102 is formed to cover the light-blocking pattern 130, the data-line 14, the first power supply line 16, and the reference power supply line 18 (S20).

Further, the active layers 111, 112 and 113 of the first, second and third thin-film transistors are formed by patterning an oxide semiconductor material on the buffer insulating-film 102 (S30).

Figure 11:
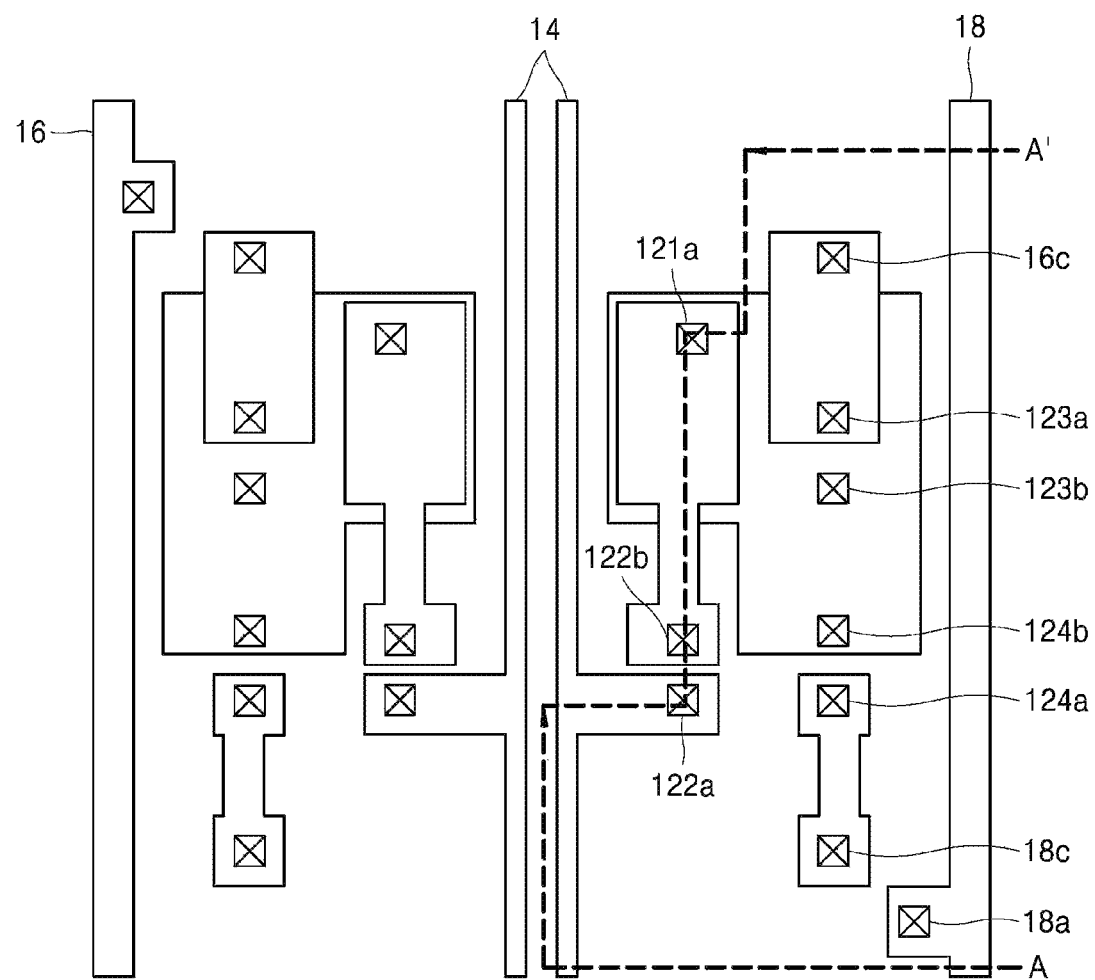
FIG. 11 illustrates a plane of a structure of a thin-film transistor array substrate formed during a manufacturing method according to one embodiment of the present disclosure.
Figure 12:
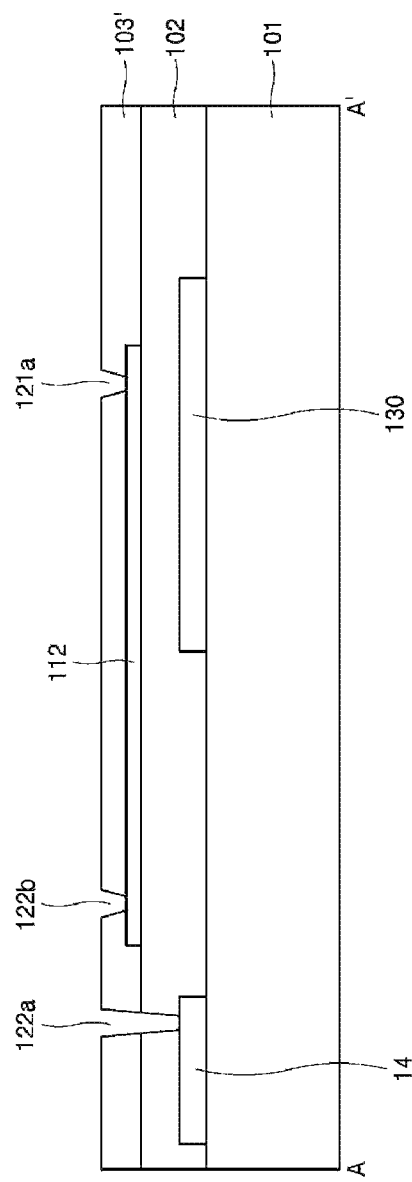
FIG. 12 illustrates a cross-section of a structure of a thin-film transistor array substrate formed during a manufacturing method according to one embodiment of the present disclosure.

As shown in FIG. 11 and FIG. 12, a pre-insulating-film 103' is formed to cover the buffer insulating-film 102 and the active layers 111, 112 and 113 of the first, second and third thin-film transistors (S40).

Further, the plurality of contact holes 16a, 16c, 18a, 18c, 121a, 122a, 122b, 123a, 123b, 124a, and 124b is formed by patterning at least the pre-insulating film 103' among the buffer insulating film 102 and the pre-insulating film 103' (S50).

In this connection, the first connecting contact-hole 16a passes through the buffer insulating-film 102 and the pre-insulating-film 103' and, thus, disposes on a portion of the first power supply line 16.

The third connecting contact-hole 16c passes through the pre-insulating-film 103' and disposes on the portion of the active layer 111 of the first thin-film transistor.

The second connecting contact-hole 18a passes through the buffer insulating-film 102 and the pre-insulating-film 103' and disposes on the portion of the reference power supply line 18.

The fourth connecting contact-hole 18c passes through the pre-insulating-film 103' and disposes on the portion of the active layer 113 of the third thin-film transistor.

The gate electrode contact-hole 121a passes through the pre-insulating-film 103' and disposes on a portion of the active layer 112 of the second thin-film transistor.

The first connecting contact-hole 122a passes through the buffer insulating-film 102 and the pre-insulating-film 103' and disposes on the portion of the data-line 14.

The second connecting contact-hole 122b passes through the pre-insulating-film 103' and disposes on another portion of the active layer 112 of the second thin-film transistor.

The first connecting contact-hole 123a passes through the pre-insulating-film 103' and disposes on a portion of the active layer 111 of the first thin-film transistor.

The second connecting contact-hole 123b passes through the buffer insulating-film 102 and the pre-insulating-film 103' and disposes on a portion of the light-blocking pattern 130.

The third connecting contact-hole 124a passes through the pre-insulating-film 103' and disposes on a portion of the active layer 113 of the third thin-film transistor.

The fourth connecting contact-hole 124b passes through the buffer insulating-film 102 and the pre-insulating-film 103' and disposes on another portion of the light-blocking pattern 130.

Figure 13:
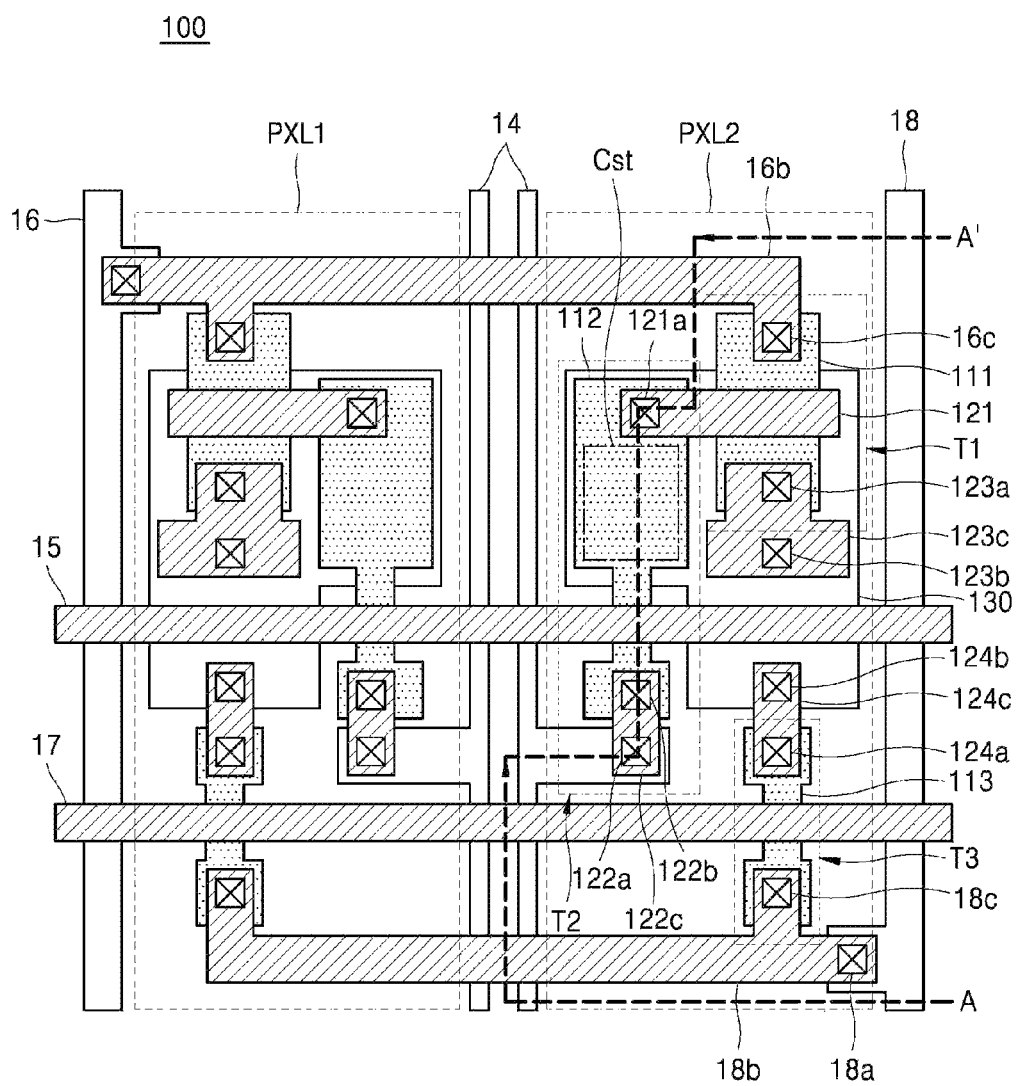
FIG. 13 illustrates a plane of a structure of a thin-film transistor array substrate formed during a manufacturing method according to one embodiment of the present disclosure.
Figure 14:
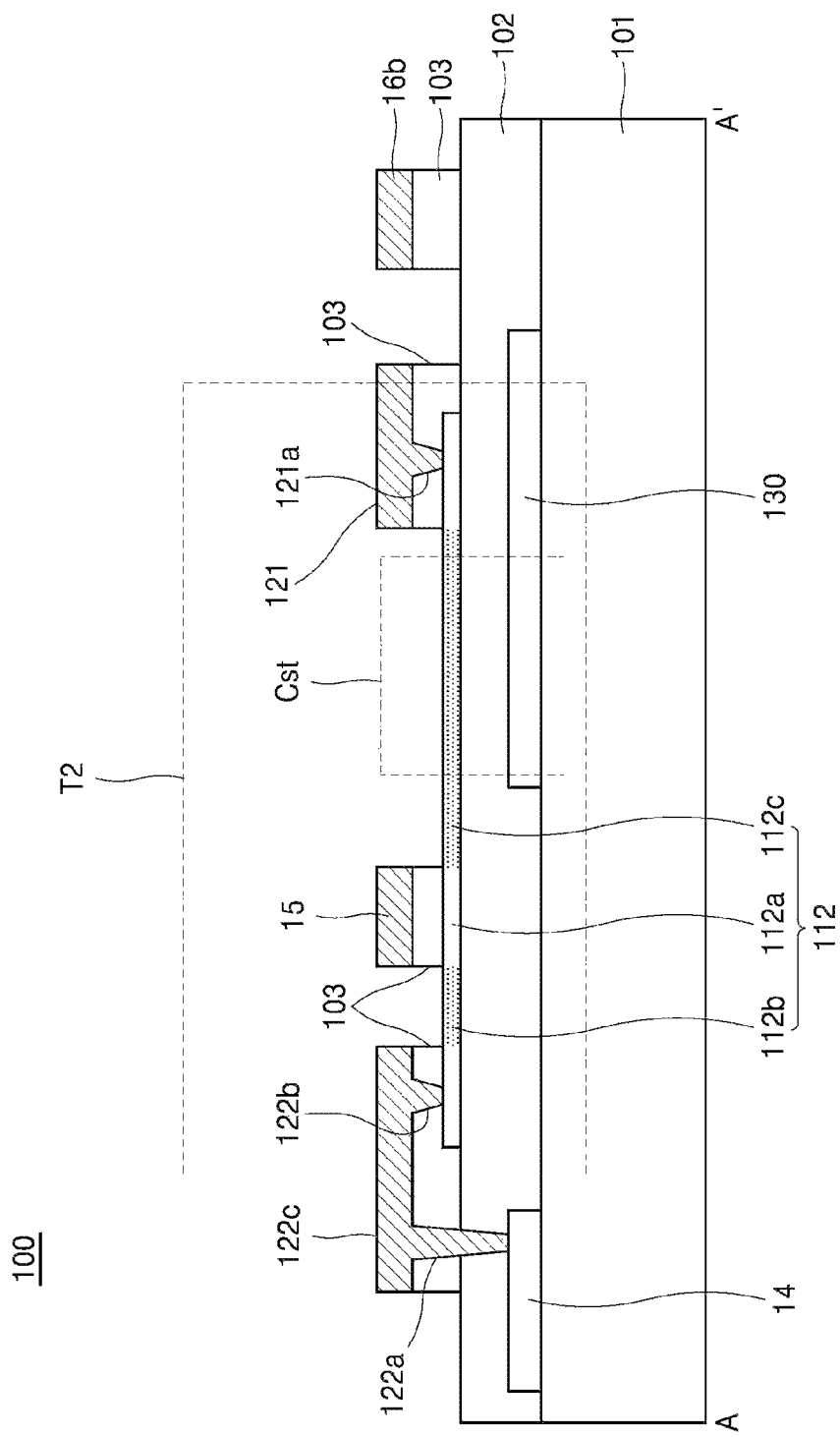
FIG. 14 illustrates a cross-section of a structure of a thin-film transistor array substrate formed during a manufacturing method according to one embodiment of the present disclosure.

Then, as shown in FIGS. 13 and 14, the pre-insulating film 103', and a conductive film (not shown) covering the plurality of contact holes 16a, 16c, 18a, 18c, 121a, 122a, 122b, 123a, 123b, 124a, and 124b and the pre-insulating film 103' are simultaneously patterned. Thus, the scan-line 15, the sense line 17, the first connecting pattern 16b, the second connecting pattern 18b, the gate electrode 121 of the first thin-film transistor, the connecting pattern 122c, the first connecting pattern 123c and the second connecting pattern 124c are formed on the gate insulating-film (S60).

At this time, the gate insulating-film 103 may be formed by patterning the pre-insulating film 103' using, as a mask, the scan-line 15, the sense line 17, the first connecting pattern 16b, the second connecting pattern 18b, the gate electrode 121 of the first thin-film transistor, the connecting pattern 122c, the first connecting pattern 123c and the second connecting pattern 124c.

Further, a portion of each active layer 111, 112 and 113 as covered by the gate insulating-film 103 defines the channel region. In addition, in each of the active layers 111, 112 and 113, the source and drain regions, which are respectively disposed on both ends of the channel region, are not covered by the gate insulating-film 103 and thus are exposed to the patterning process, and thus are made conductive.

Each of the scan-line 15 and sense-line 17 corresponds to each horizontal line including pixel regions arranged in a line in a horizontal direction among a plurality of pixel regions PXLs.

A portion of the scan-line 15 overlaps the channel region (112a in FIG. 4) in the active layer 112 of the second thin-film transistor.

A portion of the sense-line 17 overlaps the channel region (113a in FIG. 5) in the active layer 113 of the third thin-film transistor.

The first connecting pattern 16b is connected to the first power supply line 16 via the first connecting contact-hole 16a. The first connecting pattern 16b is connected to the active layer 111 of the first thin-film transistor via the third connecting contact-hole 16c. Thus, the source region (111b in FIG. 5) of the active layer 111 of the first thin-film transistor is connected to the first power supply line 16 via the first connecting pattern 16b.

The second connecting pattern 18b is connected to the reference power supply line 18 via the second connecting contact-hole 18a. The second connecting pattern 18b is connected to the active layer 113 of the third thin-film transistor via the fourth connecting contact-hole 18c. Thus, the source region 113b of the active layer 113 of the third thin-film transistor is connected to the reference power supply line 18 via the second connecting pattern 18b.

The gate electrode 121 of the first thin-film transistor is overlapped on the channel region (111a in FIG. 5) of the active layer 111 of the first thin-film transistor. The gate electrode 121 of the first thin-film transistor is connected to the drain region (112c in FIG. 4) of the active layer 112 of the second thin-film transistor via the gate electrode contact-hole 121a.

The connecting pattern 122c is connected to the data-line 14 via the first connecting contact-hole 122a. The connecting pattern 122c is connected to the active layer 112 of the second thin-film transistor via the second connecting contact-hole 122b. Thereby, the source region (112b in FIG. 4) of the active layer 112 of the second thin-film transistor is connected to the data-line 14 via the connecting pattern 122c.

The first connecting pattern 123c is connected to the active layer 111 of the first thin-film transistor via the first connecting contact-hole 123a. The first connecting pattern 123c is connected to the light-blocking pattern 130 via the second connecting contact-hole 123b.

The second connecting pattern 124c is connected to the active layer 113 of the third thin-film transistor via the third connecting contact-hole 124a. The second connecting pattern 124c is connected to the light-blocking pattern 130 via the fourth connecting contact-hole 124b.

Thus, the drain region (111c in FIG. 5) of the active layer 111 of the first thin-film transistor and the drain region (113c in FIG. 5) of the active layer 113 of the third thin-film transistor are connected to each other via the first and second connecting patterns 123c and 124c and the light-blocking pattern 130.

In this way, according to one embodiment of the present disclosure, before the step S30 of forming the active layers 111, 112 and 113, the step S10 of forming the data-line 14 together with the light-blocking pattern 130 is performed. Prior to the step S60 of forming the scan-line 15, the step S50 of forming the contact-holes is performed. Thus, in the step S60 of forming the scan-line 15, the active layers 111, 112 and 113 as exposed to the patterning process are connected to other lines or patterns via the contact-holes. Thus, charges may be discharged from the active layers 111, 112 and 113. Therefore, the overcharge burst in the active layers 111, 112 and 113 due to static electricity may be prevented.

In the above description, numerous specific details are set forth in order to provide a thorough understanding of the present disclosure. The present disclosure may be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

What is claimed is:

1. A manufacturing method for manufacturing an organic light emitting diode (OLED) display device, the manufacturing method comprising:
    forming a data line on a substrate;
    forming a buffer insulating film covering the data line on the substrate;
    forming an active layer of a switching transistor on the buffer insulating film;
    forming a gate insulating film on at least a portion of the buffer insulating film over the conducting layer and on the active layer of the switching transistor;
    forming a first connecting contact hole through the gate insulating film and the buffer insulating film to expose the data line;
    concurrently with forming the first connecting contact hole, forming a second connecting contact hole through the gate insulating film to expose the active layer of the switching transistor;
    forming a gate electrode of the switching transistor on the gate insulating film over a channel region of the active layer of the transistor; and
    concurrently with forming the gate electrode, forming a first connecting pattern on the gate insulating film, the first connecting pattern connecting to the data line via the first connecting contact hole, and the first connecting pattern connecting to the active layer of the switching transistor via the second connecting contact hole, wherein the active layer of the switching transistor is connected to the data line through the first connecting pattern and the first and second connecting contact holes.

2. The manufacturing method of claim 1, further comprising:
    forming a scan line to drive the switching transistor concurrently with forming the gate electrode, wherein the gate electrode of the switching transistor is a portion of the scan line.

3. The manufacturing method of claim 2, further comprising:
    forming a light blocking pattern on the substrate concurrently with forming the data line, wherein overlapping regions of the active layer of the switching transistor and the light blocking pattern respectively comprise a first electrode and a second electrode of a storage capacitor of the pixel with the buffer insulating film disposed in between.

4. The manufacturing method of claim 3, further comprising:
    forming a reference voltage line on the substrate concurrently with forming the data line;
    forming an active layer of a sensing transistor on the buffer insulating film concurrently with forming the active layer of the switching transistor;
    forming a sense line on the gate insulating film concurrently with forming the gate electrode, wherein a portion of the sense line overlaps with a channel region of the active layer of the sensing transistor;
    concurrently with forming the first connecting contact hole and the second contact hole, forming a third connecting contact hole and a fourth connecting contact hole, wherein the third connecting contact hole is through the gate insulating film and the buffer insulating film to expose the reference voltage line, and wherein the fourth connecting contact hole is through the gate insulating film to expose a source region of the active layer of the sensing transistor; and
    concurrently with forming the gate electrode, forming a second connecting pattern on the gate insulating film connecting to the reference voltage line via the third connecting contact hole, and connecting to the source region of the active layer of the sensing transistor via the fourth connecting contact hole.

5. The manufacturing method of claim 4, further comprising:
    concurrently with forming the first connecting contact hole and the second contact hole, forming a fifth connecting contact hole and a sixth connecting contact hole, wherein the fifth connecting contact hole is through the gate insulating film and the buffer insulating film to expose the light blocking pattern, and wherein a sixth connecting contact hole is through the gate insulating film to expose a drain region of the active layer of the sensing transistor; and concurrently with forming the gate electrode, forming a third connecting pattern on the gate insulating film connecting to the light blocking pattern via the fifth connecting contact hole and connecting to the drain region of the active layer of the sensing transistor via the sixth connecting contact hole.

6. An organic light-emitting diode (OLED) device comprising:

a substrate;

a data line providing a data voltage to a switching transistor of a pixel and disposed on the substrate;

a buffer insulating film covering the data line and disposed on the substrate;

an active layer of the switching transistor disposed on the buffer insulating film;

a gate insulating film disposed on at least a portion of the buffer insulating film and disposed on at least a portion of the active layer;

a gate electrode of the switching transistor disposed on the gate insulating film and overlapped with a channel region of the active layer of the switching transistor; and a first connecting pattern disposed on the gate insulating film, the first connecting pattern connected to the data line via a first connecting contact hole through the gate insulating film and the buffer insulating film, and the first connecting pattern connected to the active layer of the switching transistor via a second connecting contact hole through the gate insulating film, the first connecting pattern having a same material as the gate electrode, wherein the active layer of the switching transistor is connected to the data line through the first connecting pattern, the first connecting contact hole and the second connecting contact hole.

7. The OLED display device of claim 6, wherein the gate electrode of the switching transistor is connected to a scan line to drive the switching transistor.

8. The OLED display device of claim 7, further comprising:

a light blocking pattern disposed on the substrate and having a same material as the data line, wherein the buffer insulating film is further disposed on the light blocking pattern, and wherein the gate insulating film is further disposed on the buffer insulating film over the light blocking pattern;

wherein overlapping regions of the active layer of the switching transistor and the light blocking pattern respectively comprise a first electrode and a second electrode of a storage capacitor of the pixel with the buffer insulating film disposed in between.

9. The OLED display device of claim 8, further comprising:

a driving transistor connected to an organic light-emitting element, wherein the switching transistor is disposed between the data line and the driving transistor;

a sensing transistor disposed between the organic light-emitting element and a reference voltage line;

wherein the reference voltage line is disposed on the substrate;

wherein an active layer of the driving transistor is disposed on the buffer insulating film;

wherein an active layer of the sensing transistor is disposed on the buffer insulating film;

wherein the active layer of the switching transistor has a larger area than each of the active layer of the driving transistor and the active layer of the sensing transistor.

10. The OLED display device of claim 9, further comprising:

a gate electrode of the driving transistor disposed on the gate insulating film, wherein a portion of the gate electrode of the driving transistor overlaps with a channel region of the active layer of the driving transistor and another portion of the gate electrode of the driving transistor overlaps with a drain region of the active layer of the switching transistor, wherein the gate electrode of the driving transistor connected to a drain region of the active layer of the switching transistor via a gate electrode contact hole through the gate insulating film; and a second connecting pattern disposed on the gate insulating film, the second connecting pattern connected to the light blocking pattern via a third connecting contact hole through the gate insulating film and the buffer insulating film, and the second connecting pattern connected to a drain region of the active layer of the driving transistor via a fourth connecting contact hole through the gate insulating film.

11. The OLED display device of claim 9, further comprising:

a sense line disposed on the gate insulating film, wherein a portion of the sense line overlaps with a channel region of the active layer of the sensing transistor; and a second connecting pattern disposed on the gate insulating film, the second connecting pattern connected to the reference voltage line via a third connecting contact hole through the gate insulating film and the buffer insulating film, and the second connecting pattern connected to a source region of the active layer of the sensing transistor via a fourth connecting contact hole through the gate insulating film.

12. The OLED display device of claim 11, further comprising:

a third connecting pattern disposed on the gate insulating film, the third connecting pattern connected to the light blocking pattern via a fifth connecting contact hole through the gate insulating film and the buffer insulating film, and the third connecting pattern connected to a drain region of the active layer of the sensing transistor via a sixth connecting contact hole through the gate insulating film.

* * * * *